United States Patent
Whalen et al.

(10) Patent No.: US 6,680,217 B2
(45) Date of Patent: Jan. 20, 2004

(54) APPARATUS FOR PROVIDING MECHANICAL SUPPORT TO A COLUMN GRID ARRAY PACKAGE

(75) Inventors: Timothy Whalen, Manassas, VA (US); Santos H. Nazario-Camacho, Culpeper, VA (US); Daniel S. Sherick, Manassas, VA (US)

(73) Assignee: BAE Systems Information and Electronic Systems Integration, Inc., Nashua, NH (US)

(*) Notice: Subject to any disclaimer, the term of this patent is extended or adjusted under 35 U.S.C. 154(b) by 0 days.

(21) Appl. No.: 10/455,506

(22) Filed: Jun. 5, 2003

(65) Prior Publication Data

US 2003/0211653 A1 Nov. 13, 2003

Related U.S. Application Data

(62) Division of application No. 10/142,027, filed on May 9, 2002.

(51) Int. Cl.[7] .................................................. H01L 21/00
(52) U.S. Cl. ........................................ 438/106; 438/108
(58) Field of Search ............................... 438/106, 107, 438/108, 109, 118, 121, 125

(56) References Cited

U.S. PATENT DOCUMENTS

| | | | |
|---|---|---|---|
| 4,393,581 A | * 7/1983 | Cherian | 29/827 |
| 5,186,377 A | 2/1993 | Rawson et al. | |
| 5,220,200 A | * 6/1993 | Blanton | 257/778 |
| 5,585,671 A | * 12/1996 | Nagesh et al. | 257/697 |
| 5,825,635 A | 10/1998 | Mukoyama et al. | |
| 5,933,343 A | 8/1999 | Lu et al. | |
| 6,218,730 B1 | 4/2001 | Toy et al. | |
| 6,414,381 B1 | * 7/2002 | Takeda | 257/676 |
| 6,461,881 B1 | * 10/2002 | Farnworth et al. | 438/107 |

* cited by examiner

*Primary Examiner*—Michael Trinh
(74) *Attorney, Agent, or Firm*—Daniel J. Long; Antony P. Ng; Bracewell & Patterson, L.L.P.

(57) ABSTRACT

An apparatus for providing mechanical support to a column grid array package is disclosed. The column grid array package uses solder columns to provide electrical connections between a ceramic substrate and a printed circuit board. The ceramic substrate has two sides, with an integrated circuit chip mounted on one side and many input/output pads mounted on the other side. Solder columns are attached between the input/output pads and the printed circuit board. A corner post is located at each corner of the column grid array package to secure the position of the ceramic substrate in relation to the printed circuit board.

7 Claims, 4 Drawing Sheets

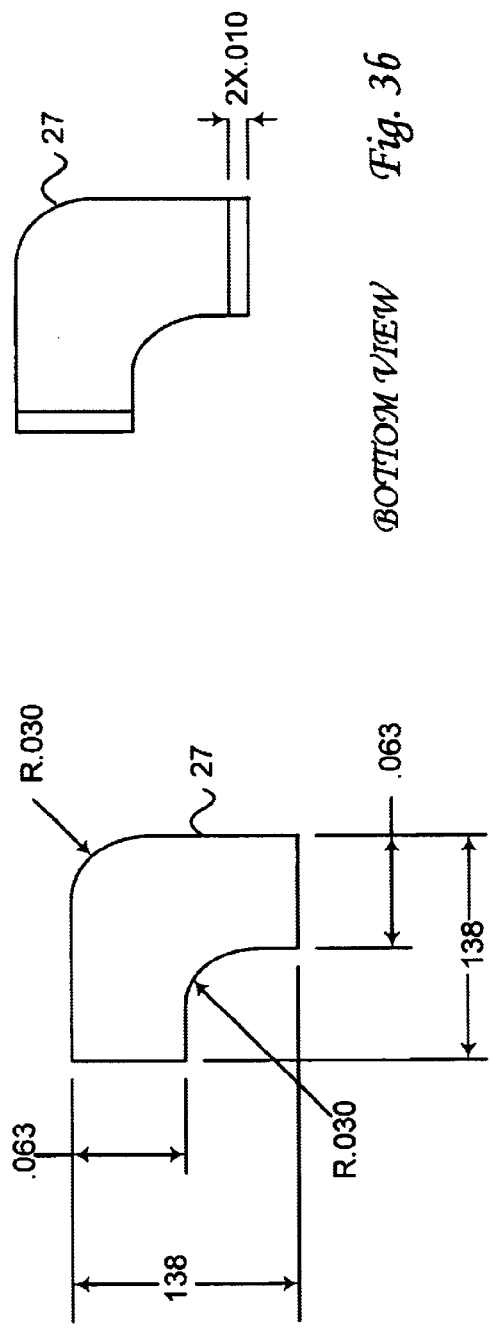
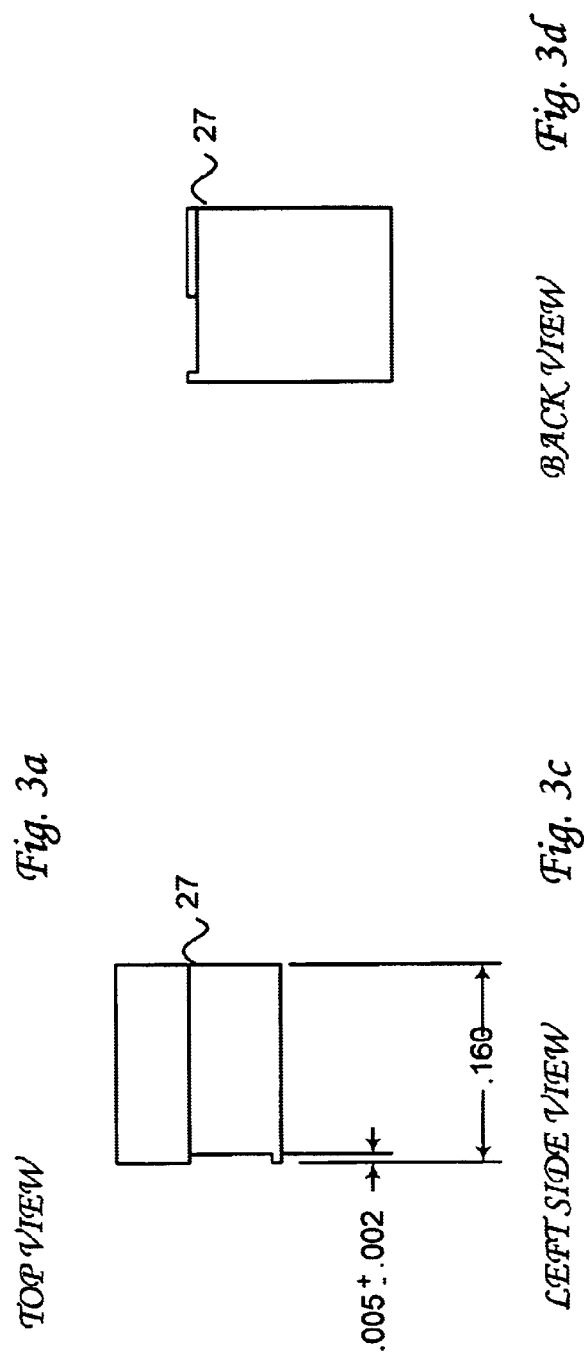

APPARATUS FOR PROVIDING MECHANICAL SUPPORT TO A COLUMN GRID ARRAY PACKAGE

This is a Division of application Ser. No. 10/142,027, filed May 9, 2002 allowed pending.

BACKGROUND OF THE INVENTION

1. Technical Field

The present invention relates to semiconductor device packaging in general, and in particular to packaging for semiconductor devices having a column grid array. Still more particularly, the present invention relates to an apparatus for providing mechanical support to a column grid array package.

2. Description of the Related Art

Ceramic column grid array packages are commonly employed by many types of high-performance integrated circuit devices. Ceramic column grid array packages use solder columns to define electrical connections between a ceramic substrate (on which an integrated circuit chip is placed) and a printed circuit board. The solder columns are formed from high-melting temperature solder using an alloy of lead and tin. The aspect ratio of the solder columns used in a ceramic column grid array package is approximately 9:2, and the diameter of the solder columns is approximately 0.020 inches. The solder columns are first bonded to the ceramic substrate, and thereafter attached to the printed circuit board using conventional low-melting temperature solder paste reflow techniques that are well-known in the art.

One problem with ceramic column grid array packages is that the solder columns are susceptible to failures under high-frequency vibrations and shock tests. One approach to reinforcing the solder column connections of ceramic column grid array packages involves the placement of Kovar or Cusil pins in the corners of the ceramic column grid array packages to maintain the position of the ceramic column grid array package in relation to the printed circuit board in the presence of vibrations and compressive forces. Typically, Kovar or Cusil pins are first attached to a ceramic substrate by brazing, and the Kovar or Cusil pins are then positioned into holes located in a printed circuit board. However, the use of Kovar or Cusil pins results in numerous additional and complicate manufacturing steps. Thus, the above-mentioned usage of Kovar or Cusil pins are not commonly found in ceramic column grid array packages.

Consequently, it is desirable to provide an improved apparatus for providing mechanical support to ceramic column grid array packages.

SUMMARY OF THE INVENTION

In accordance with a preferred embodiment of the present invention, a ceramic column grid array package uses solder columns to provide electrical connections between a ceramic substrate and a printed circuit board. The ceramic substrate has two sides, with an integrated circuit chip mounted on one side and many input/output pads mounted on the other side. Solder columns are attached between the input/output pads and the printed circuit board. A corner post is located at each corner of the ceramic column grid array package to secure the position of the ceramic substrate in relation to the printed circuit board.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIGS. 3a–3d are various views of the corner post from FIG. 1, in accordance with a preferred embodiment of the present invention.

DESCRIPTION OF A PREFERRED EMBODIMENT

The present invention is applicable to high-performance semiconductor devices such as microprocessors and application specific integrated circuits (ASICs), which employ column grid array packages. The present invention is particularly suited for ceramic column grid array packages.

Figure 1:
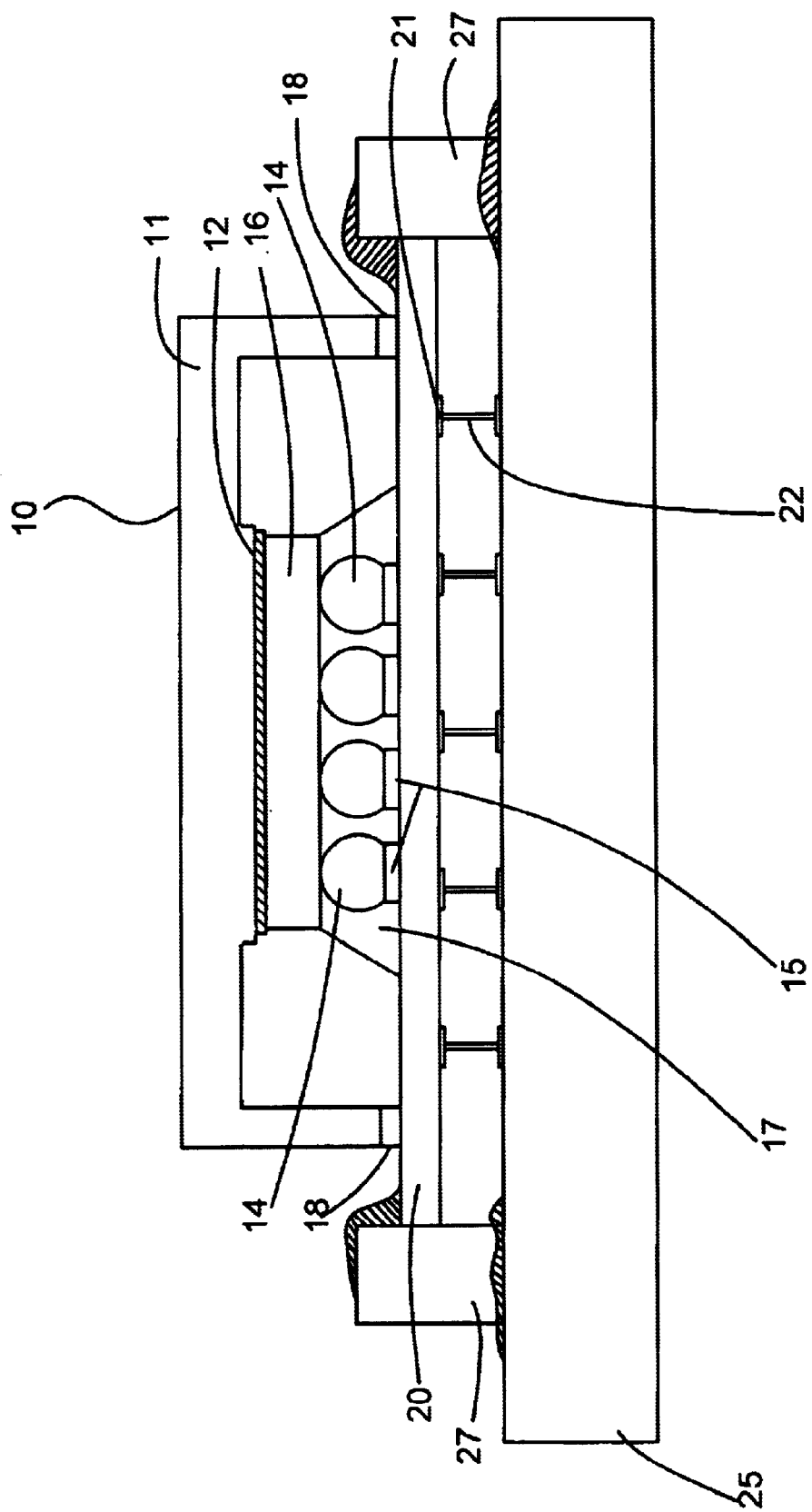
FIG. 1 is a diagram of a column grid array package having corner posts in accordance with a preferred embodiment of the present invention.

Referring now to the drawings and in particular to FIG. 1, there is depicted a diagram of a column grid array package having corner posts in accordance with a preferred embodiment of the present invention. As shown, a column grid array package 10 is mounted on a printed circuit board 25. Printed circuit board 25 is typically made up of one or more layers of conducting films comprising an organic laminate composite. Column grid array package 10 is formed by securing a chip 16 to a ceramic substrate 20 via multiple solder balls 14 situated on their respective pads 15 that are located on substrate 20. For some applications, solder balls 14 and pads 15 are immersed within an encapsulate such as an epoxy 17. A thermally conductive material 12 is applied over the exposed surface of chip 16 such that a direct thermal contact is made between chip 16 and a cover 11 utilized to protect chip 16. A cover sealant 18 is included to secure cover 11 to substrate 20.

Substrate 20 is attached to a printed circuit board 25 via solder columns 22. Specifically, each of solder columns 22 is attached to the bottom surface of substrate 20 on a respective one of input/output pads 21 with eutectic solder. Similarly, the other end of each of solder columns 22 is attached to the top surface of printed circuit board 25 via eutectic solder. Solder columns 22 are formed of a solder alloy having a high-melting point in the range of 270° C. to 300° C. The solder column material is wettable with low-melting point solder. The diameter of each of solder columns 22 is in the range of approximately 0.3 mm to approximately 0.5 mm, which is sufficient to provide good electrical interconnections for the microelectronic integrated circuit devices. The height of each of solder columns 22 is in the range of approximately 1.0 mm to approximately 2.5 mm.

Figure 2:
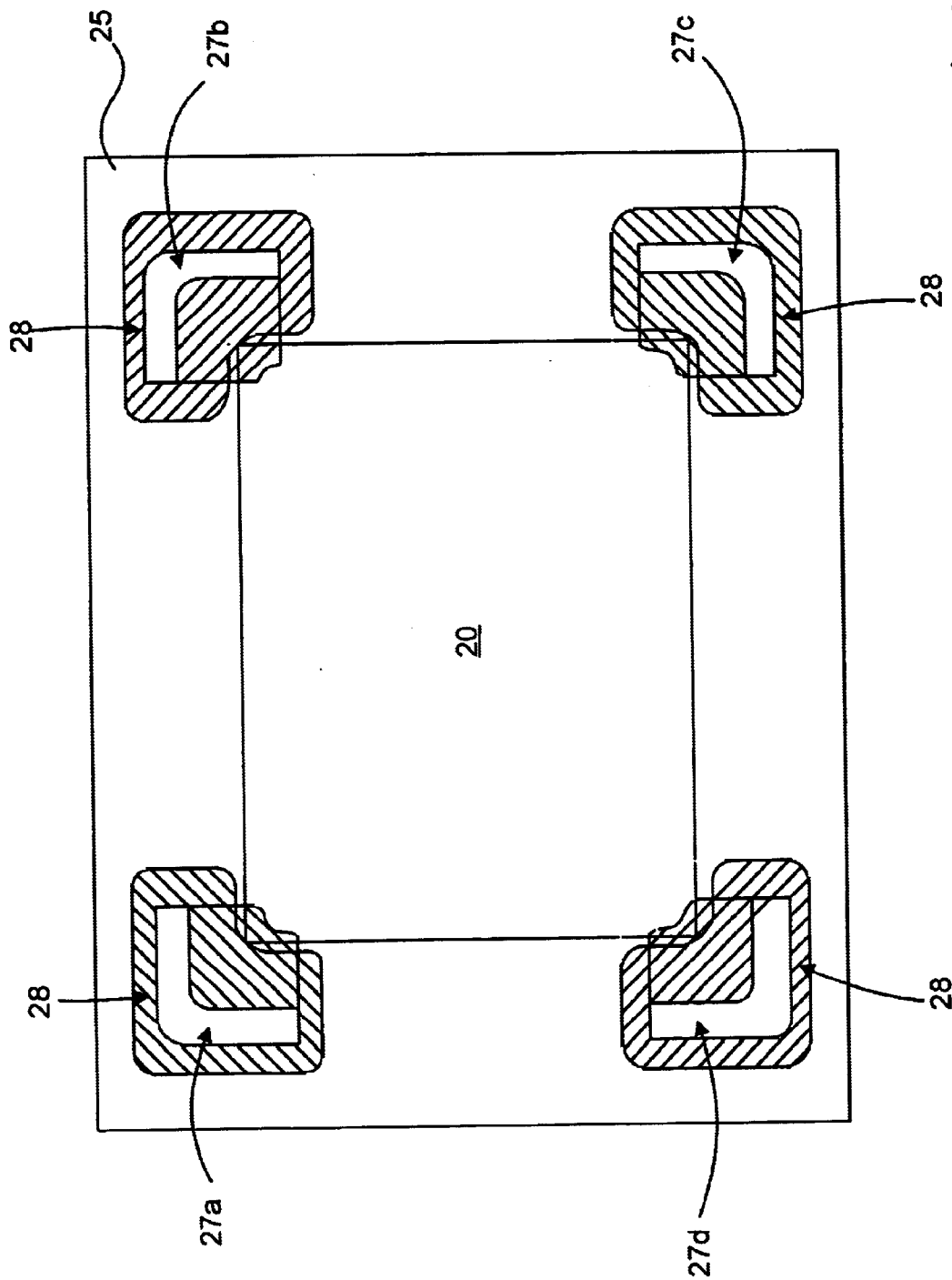
FIG. 2 is a top view of the column grid array package from FIG. 1, in accordance with a preferred embodiment of the present invention.

In accordance with a preferred embodiment of the present invention, a corner post, such as a corner post 27, is added at each of the four corners of ceramic substrate 20 in order to secure and maintain the position of ceramic substrate 20 in relation to printed circuit board 25. The preferred locations of the four corner posts within column grid array package 10 is shown in FIG. 2. As shown, corner posts 27a–27d are separately located at four corners of ceramic substrate 20. Corner posts 27a–27d are preferably made of aluminum in order to match the coefficient of thermal expansion of the solder that solder columns 22 are made up of. Corner posts 27a–27d are bonded to ceramic substrate 20 and printed circuit board 25 using adhesives and a rigid epoxy 28. Epoxy 28 should be stiff and tough enough to withstand any shock without deflecting or cracking.

Referring now to FIGS. 3a–3d, there are illustrated various views of corner post 27 from FIG. 1, in accordance with a preferred embodiment of the present invention. Specifically, FIG. 3a is the top view of corner post 27, FIG. 3b is the bottom view of corner post 27, FIG. 3c is the left side view of corner post 27, and FIG. 3d is the back view of corner post 27. Preferably, corner post 27 is an "L" shape metal structure. The crucial dimensions of corner post 27 are illustrated in FIGS. 3a–3c.

Figure 4:
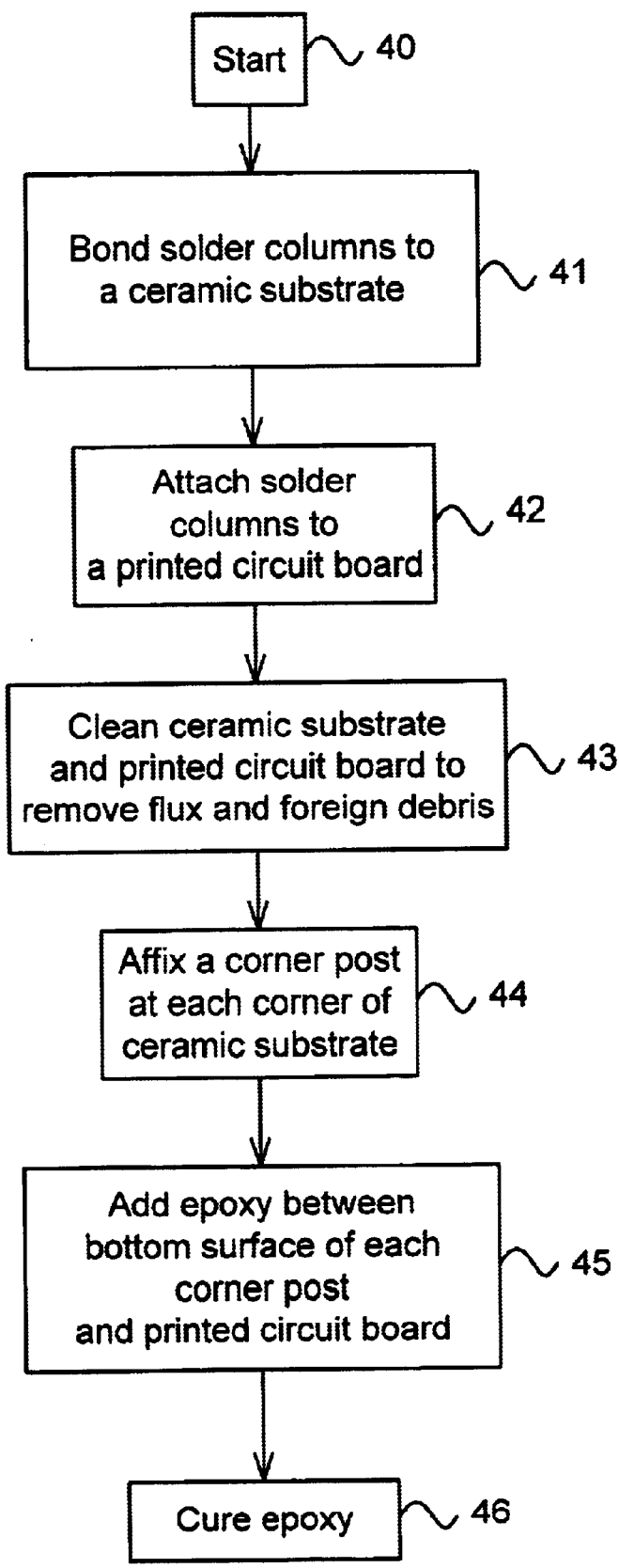
FIG. 4 is a high-level process flow diagram of a method for providing corner posts to a column grid array package, in accordance with a preferred embodiment of the present invention.

With reference now to FIG. 4, there is a high-level process flow diagram of a method for providing corner posts to a column grid array package, in accordance with a preferred embodiment of the present invention. Starting at block 40, solder columns are first bonded to a ceramic substrate, as shown in block 41. Then, the solder columns are attached to a printed circuit board using low-melting temperature solder paste reflow techniques, as depicted in block 42. The ceramic substrate and the printed circuit board are then cleaned to remove flux and any other foreign debris, as shown in block 43. Next, a corner post, such as corner post 27 from FIG. 3, is affixed at each corner of the ceramic substrate via adhesives, as depicted in block 44. Epoxy is then added between the bottom surface of each corner post and the printed circuit board, as shown in block 45. The epoxy is preferably manufactured by Hysol, part number EA9309.3NA. The epoxy joint is preferably between the range of 0.005 and 0.015 inches thick. The epoxy forms a fillet on all sides between the printed circuit board and the corner post. The fillet on the outside edges of a corner post preferably extend a minimum of 0.040 inches up the vertical wall of the corner post. The epoxy also bridges between the side of the ceramic substrate and corner post. An epoxy fillet is produced on each corner between the top surface of the ceramic substrate and the vertical wall of the corner post up to the top of the corner post. In order to ensure that a complete fill of epoxy at each of the corner posts, the corner posts are bonded to the outside corner of the substrate and to the printed circuit board preferably at the same time. In other words, the steps depicted in blocks 44 and 45 are preferably performed simultaneously. The epoxy is then be cured preferably at a temperature of 100° C. for an hour, as depicted in block 46.

As has been described, the present invention provides an apparatus for providing mechanical support to a column grid array package. Although a ceramic column grid array package is used to illustrate the present invention, it is understood by those skilled in the art that the present invention can also be applied to a plastic substrate and/or solder balls in lieu of solder columns. One significant advantage of the present invention over the prior art Kovar/Cusil pin approach is that the present invention can be applied to similar packages other than ceramic column grid array packages, such as ceramic ball grid array packages, plastic ball grid array packages, etc., without having to customize the package itself.

While the invention has been particularly shown and described with reference to a preferred embodiment, it will be understood by those skilled in the art that various changes in form and detail may be made therein without departing from the spirit and scope of the invention.

What is claimed is:

1. A method for providing corner posts to a column grid array package, said method comprising:

bonding a plurality of wire columns to a substrate;

attaching said plurality wire columns to a printed circuit board;

affixing a corner post at each corner of said substrate; and applying epoxy between a bottom surface of each of said corner posts and said printed circuit board to secure the position of said substrate in relation to said printed circuit board.

2. The method of claim 1, wherein said corner post is made of aluminum.

3. The method of claim 1, wherein said corner post is in an "L" shape.

4. The method of claim 1, wherein said attaching further includes attaching said plurality wire columns to a printed circuit board via an adhesive.

5. The method of claim 1, wherein said method further includes forming an epoxy fillet on at least one side between said corner post and said printed circuit board.

6. The method of claim 1, wherein said method further includes forming an epoxy fillet on a corner between a top surface of said substrate and a vertical wall of said corner post.

7. The method of claim 1, wherein said method further includes curing said epoxy at 100° C. for an hour.

* * * * *